United States Patent
Rolandi et al.

(10) Patent No.: US 6,507,517 B2
(45) Date of Patent: Jan. 14, 2003

(54) CIRCUITAL STRUCTURE FOR PROGRAMMING DATA IN A NON-VOLATILE MEMORY DEVICE

(75) Inventors: Paolo Rolandi, Voghera (IT); Massimo Montanaro, Pavia (IT); Giorgio Oddone, Rossigione (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 21 days.

(21) Appl. No.: 09/871,235

(22) Filed: May 30, 2001

(65) Prior Publication Data

US 2002/0015326 A1 Feb. 7, 2002

(30) Foreign Application Priority Data

May 31, 2000 (EP) .............................................. 00830392

(51) Int. Cl.[7] .............................................. G11C 16/04
(52) U.S. Cl. .............................. 365/185.2; 365/185.11
(58) Field of Search ........................ 365/185.2, 185.11, 365/185.21, 185.03, 185.17, 185.24

(56) References Cited

U.S. PATENT DOCUMENTS

| | | | |
|---|---|---|---|
| 5,444,656 A | 8/1995 | Bauer et al. | 365/189.01 |
| 5,629,892 A | 5/1997 | Tang | 365/185.2 |
| 5,748,546 A | 5/1998 | Bauer et al. | 365/210 |
| 5,774,395 A | 6/1998 | Richart et al. | 365/185.2 |
| 5,905,673 A | 5/1999 | Khan | 365/185.03 |
| 5,936,906 A | 8/1999 | Tsen | 365/210 |
| 6,055,187 A * | 4/2000 | Dallabora et al. | 365/185.21 |
| 6,118,701 A * | 9/2000 | Uekubo | 365/185.2 |
| 6,122,196 A * | 9/2000 | Tanaka et al. | 365/185.11 |
| 6,317,362 B1 * | 11/2001 | Nomura et al. | 365/185.2 |

FOREIGN PATENT DOCUMENTS

| | | |
|---|---|---|
| EP | 0753859 A1 | 1/1997 |
| EP | 0798727 A1 | 10/1997 |
| EP | 0978844 A1 | 2/2000 |
| JP | 05182470 | 7/1993 |

* cited by examiner

Primary Examiner—Richard Elms
Assistant Examiner—Anh Phung
(74) Attorney, Agent, or Firm—Lisa K. Jorgenson; Robert Iannucci; Seed IP Law Group PLLC

(57) ABSTRACT

A circuit structure for programming data in reference cells of an electrically programmable/erasable integrated non-volatile memory device includes a matrix of multi-level memory cells and a corresponding reference cell provided for comparison with a respective memory cell during the read phase. The reference cell is incorporated, along with other cells of the same type, in a reference cell sub-matrix which is structurally independent of the memory cell matrix and directly accessed from outside in the DMA mode. The bit lines of the sub-matrix branch off to a series of switches which are individually operated by respective control signals REF(i) issued from a logic circuit with the purpose of selectively connecting the bit lines to a single external I/O terminal through a single addressing line of the access DMA mode.

20 Claims, 4 Drawing Sheets

CIRCUITAL STRUCTURE FOR PROGRAMMING DATA IN A NON-VOLATILE MEMORY DEVICE

TECHNICAL FIELD

The invention broadly relates to an electronic multi-level non-volatile memory device which is monolithically integrated in a semiconductor and incorporates a circuit structure for programming data contained in the memory.

In particular, the invention relates to a circuit structure for writing reference cells of a multi-level non-volatile memory, and the following description is made with reference to this field of application for convenience of explanation.

BACKGROUND OF THE INVENTION

As it is well known in this specific technical field, recent developments in the manufacture of non-volatile memories, specifically memories of the EPROM, EEPROM and FLASH types, point toward an increase of their storage capacity by the adoption of multi-level architectures, that is, memory matrices whose cells can store multiple logic states.

A preliminary comparative review of the circuit structures with conventional two-level memories may help, however, to make the aspects of this invention more clearly understood.

Electronic memory devices usually comprise at least one matrix of memory cells laid into rows and columns of the matrix. Logic information can be written or read into/from each cell by suitably biasing the corresponding row or column.

A typical memory cell comprises a field-effect transistor having a control gate terminal, a floating gate region, a source terminal, and a drain terminal. A range of electric potentials separates the two possible logic states of a two-level memory cell—e.g., a logic "0" to indicate a programmed cell, and a logic "1" to indicate an erased cell.

In operation, for the purpose of discriminating the informational contents of a two-level non-volatile memory cell, the memory cell is compared with a structurally identical reference cell which contains a known logic value.

The operation for selecting a cell in order to read its informational contents consists of applying a suitable bias voltage to the control gate terminal of the memory cell. If the cell has previously been programmed, then an electric charge is trapped within its floating gate region, and the threshold voltage of the cell is such that makes the drain current conduction lower than the reference cell.

On the other hand, if the cell has been erased, no electric charge is trapped within its floating gate region, and the conduction state of the cell can be identified using an unbalanced-load technique of comparison with the reference cell.

Thus, a method most frequently used for reading from a flash type of memory cell consists of comparing the current drawn by the cell to be read and the current drawn by the reference cell. A simple comparator, known as sense amplifier, is used to perform the comparison and outputs a corresponding result.

In the instance of a multi-level memory device, no less than $2^n-1$ references are needed to discriminate a cell having an n-bit storage capacity; such references may be voltage- or current-oriented, depending on the reading method applied.

As an example, a prior method of determining the state of an n-level memory cell is described in the U.S. Pat. No. 5,774,395, wherein the reference cell is electrically erased in order to determine the threshold voltage of the reference cell with high accuracy within a wide range of voltages, e.g., of −5 to 15 Volts. Briefly, selected elements of the multi-level reference cell are electrically erased and re-programmed to allow a detection and a fine tuning of the multiple logic states present in a memory cell, i.e., disallow overlap of cell states.

Thus, unlike a two-level memory, the reference cells of a multi-level memory require an additional program circuitry for writing into the reference cells the intermediate logic levels to compare with the programmed or programmable ones in the memory cell matrix.

The prior art conventionally used in two-level non-volatile memories provides for allocation of the reference cells and of memory cells to the same matrix. However, this solution is not easily extended to multi-level memories because this would require a circuit area increase with the number of bits, and because the reference cells of a multi-level memory must be programmed.

These difficulties are emphasized by the use of different reference cells for reading and programming. In fact, a reference line including the same number of reference cells as the matrix cells could affect the reference cell read and/or program time quite significantly.

SUMMARY OF THE INVENTION

An embodiment of this invention provides a circuit structure whereby reference cells, preferably but not exclusively of the multi-level type, can be simply and accurately programmed with only a minor impact on the circuit area of the memory device and the programming speed of such reference cells.

The circuit structure includes, for each matrix block included in a specific read sector, a corresponding external array which contains all the reference cells needed for comparison with the selected matrix cells. The reference cells contained in said array are accessed directly using a conventional DMA (Direct Memory Access) technique.

The features and advantages of a circuit structure according to the invention will be apparent from the following description of an embodiment thereof, given by way of non-limitative example with reference to the accompanying drawings.

DETAILED DESCRIPTION OF THE INVENTION

Figure 1:
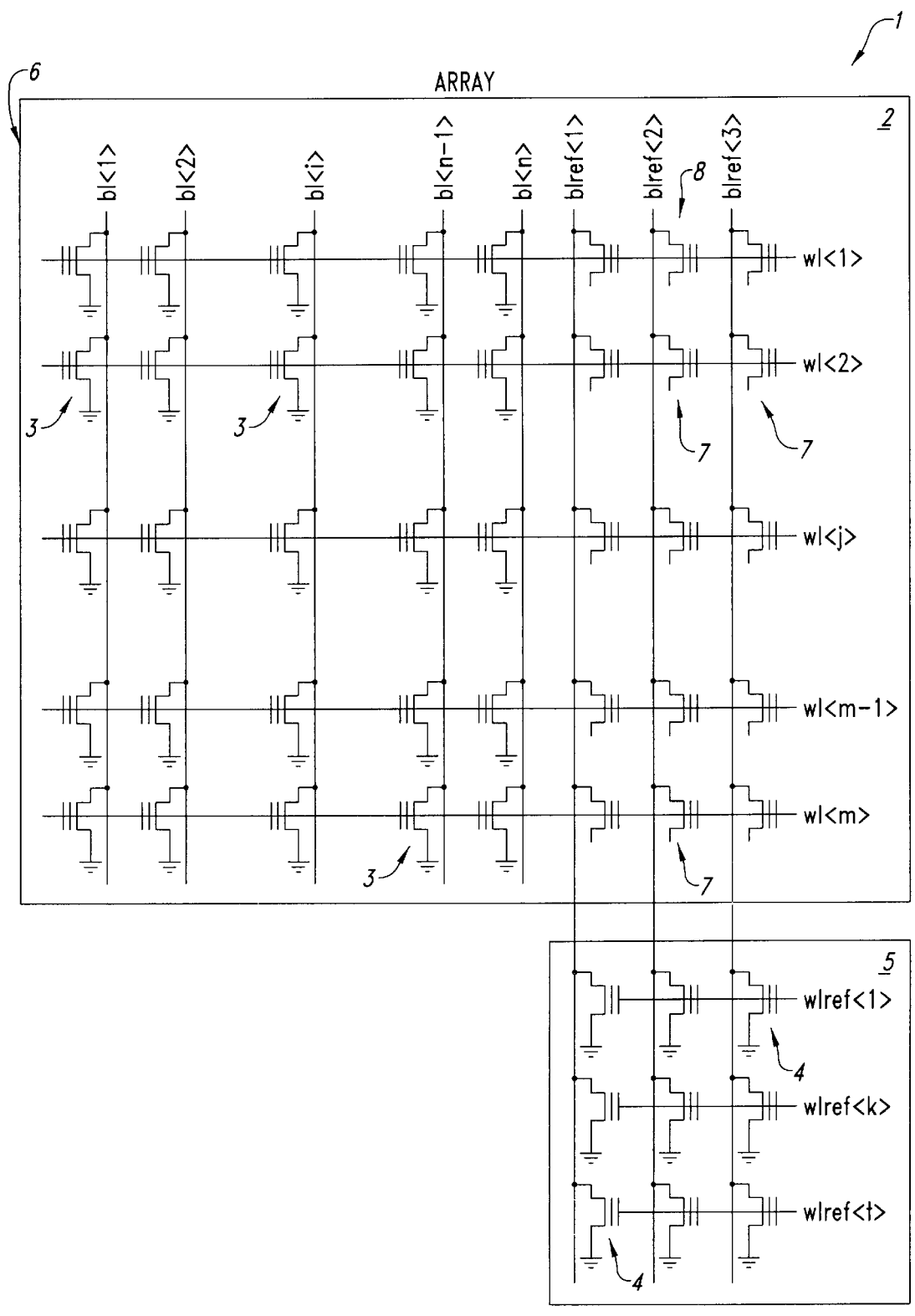
FIG. 1 schematically shows an electrically programmable/erasable non-volatile memory device according to an embodiment of the invention.

Referring to the drawings, a circuit structure for a non-volatile memory device incorporating a matrix 2 of memory cells 3, according to this invention, is generally and schematically shown at 1.

This memory device is monolithically integrated on a semiconductor and is electrically programmable/erasable, it being of the EEPROM or the flash type, for example. Furthermore, this memory device can be of the single or the dual supply type.

The following considerations apply, however, to any other type of EEPROM or flash memories, as well as to EPROMs.

The memory matrix 2 is organized into m rows or word lines w1 and n columns or bit lines b1. Each cell 3 comprises essentially a floating-gate transistor having drain and source regions formed on a semiconductor substrate and separated by a channel region. The floating gate is formed on top of the substrate and is isolated therefrom by a thin gate oxide layer. A control gate is capacitively coupled to the floating gate through a dielectric layer. The control gate is the control terminal of the transistor, while the drain and source terminals are conduction terminals.

Figure 2:
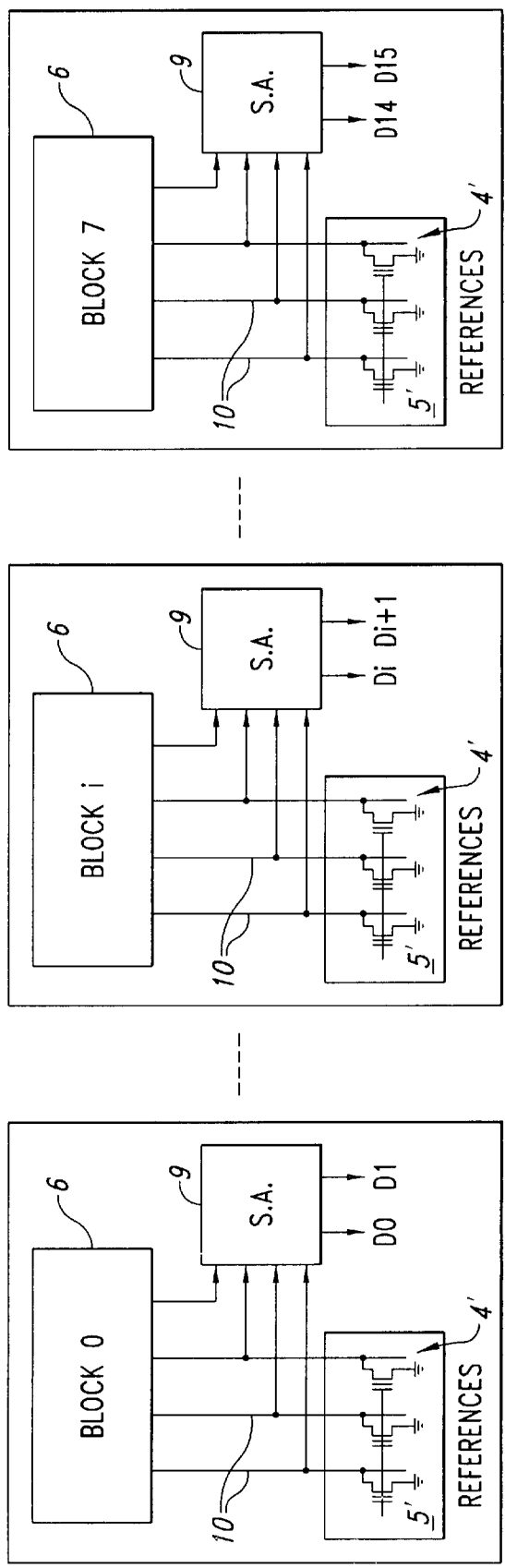
FIG. 2 is a schematic diagram of a portion of the memory device shown in FIG. 1.

The matrix 2 of memory cells 3 is preferably divided into a plurality of electrically programmable sectors 6, which can also be programmed by single bytes. For explanation purposes only, in the diagram of FIG. 1 is shown how the matrix may be regarded either as a whole or as represented by a given sector. In FIG. 2, the matrix sectors 6 are designated as BLOCK0, . . . BLOCKi, . . . , BLOCK7.

As it is well known, memory cells 3 belonging to the same word line w1 share the electric line which drives the respective control gates, whereas memory cells 3 belonging to the same bit line b1 share the drain terminals. The source terminals of the memory cells are all connected to a ground reference.

With suitable voltage values being applied to the terminals of a memory cell 3, the state of the latter can be altered by changing the charge amount present in the floating gate. The operation of storing charge into the floating gate is called "programming" and consists of biasing the control gate and the drain terminal to a predetermined voltage value which lies above the potential at the source terminal.

A flash memory can be programmed either by the sector (page mode) or the byte (byte mode). In the page mode, all the cells of the same matrix row are simultaneously addressed. In the byte mode, a single byte of the plural bytes available is addressed in the same row.

To erase a flash memory cell, to the source terminal is applied a voltage approximately equal to the program voltage, while the drain terminal is held floating and the control gate is either connected to ground or to a negative voltage reference. Similar as with programming, a cell can be deleted by single or multiple sectors.

For reading, the current draw of a memory cell 3 is simply compared with that of a reference cell 4, the latter usually being a virgin cell with the same structure as the memory cell.

The read operation, whereby a cell 3 is selected for the purpose of reading its informational contents, consists of applying a suitable bias voltage to the control gate terminal of the memory cell. If the cell 3 has been preliminarily programmed, then an electric charge is trapped within its floating gate region, and the threshold voltage of the cell is such that its drain current conduction will be below that of the reference cell 4.

On the other hand, if the cell 3 has been erased, no charge is trapped within its floating gate region, and the cell will be conducting a larger drain-source current than the reference cell 4.

Advantageously, the reference cells 4 which are compared with the matrix cells during a read phase are contained in a sub-matrix 5 which is structurally independent of the memory matrix 2.

The sub-matrix 5 of reference cells 4 is similar in construction to the memory cell matrix, meaning that reference cells 4 belonging to the same word line also share the electric line used for driving their respective control gates, whereas reference cells 4 belonging to the same bit line share the drain terminals in common.

It should be understood that conduction paths 10 are provided for linking the matrix 2 and sub-matrix 5 together.

More particularly, the bit lines (b1ref) 10 of the sub-matrix 5 of reference cells 4 are extended continuously into the memory cell matrix 2. These bit lines b1ref extended into the matrix 2 will be referred to as dummy bit lines.

Suitably, the total capacitive load of the dummy bit lines is effectively compensated by plural cells 7, referred to as dummy cells, being connected to the dummy bit lines b1ref inside the matrix structure 2.

These dummy cells 7 have their respective source terminals held floating and unconnected to ground, in contrast with the memory cells 3 in the matrix 2.

Thus, selecting any of the wordlines w1 of the memory matrix 2 actually would involve no activation of dummy cells 7, the latter being never conducting.

In practice, during a reading phase, a matrix cell 3 to be read and a corresponding dummy cell 7 are selected simultaneously, the dummy cell behaving as if it were fully written. In this way, the combined capacitive weights of the gate and junction capacitances of both the dummy cell 7 and its bit line are taken into account, promoting accurate matching to the matrix cells 3.

However, the reference cells 4 should be regarded as being external of the memory cell matrix and associated with respective additional word lines which are always selected.

It is as if the sub-matrix 5 of reference cells 4 were associated with a sub-matrix 8 of disconnected dummy cells 7.

It might occur to the skilled person in the art of adding some redundant reference word lines in order to ensure a quantum of redundancy to the reference cells 4 in the event of one of these cells being damaged. In fact, a single damaged reference cell 4 would be enough to impair the operability of the whole memory device.

A modified embodiment will now be described with reference to the example shown in FIG. 2 which suits a memory device having multi-level memory cells 3'.

FIG. 2 shows schematically a plurality of matrix sectors 6, each having a corresponding sub-matrix 5' of reference cells 4' associated therewith.

Thus, the sub-matrix 5' of reference cells 4' is duplicated for each read sectors BLOCK0, . . . , BLOCK7.

Each sector 6 can have two or more outputs O0; O1; . . . ; Oi, Oi+1, dependent on the number of bits stored in the basic cell 3'. These outputs are produced, of course, by a read amplifier block or sense amplifier (SA) 9 associated with each sector 6 of the cell matrix.

FIG. 2 illustrates the instance of a multi-level memory device having a two-bit cell 3'. The reference cells 4' are associated with each sector for the purpose of avoiding all kinds of asymmetry along the conduction path that allows the memory cells 3' to be read. In fact, were a single matrix of reference cells 4' be arranged to serve the entire matrix of memory cells 3' by duplication of reference currents or voltages, the reference cell matrix would be unable to provide true duplicates because of unavoidable mismatch of the read operation. With multi-level cells, the read operation should be as accurate as possible.

Figure 3:
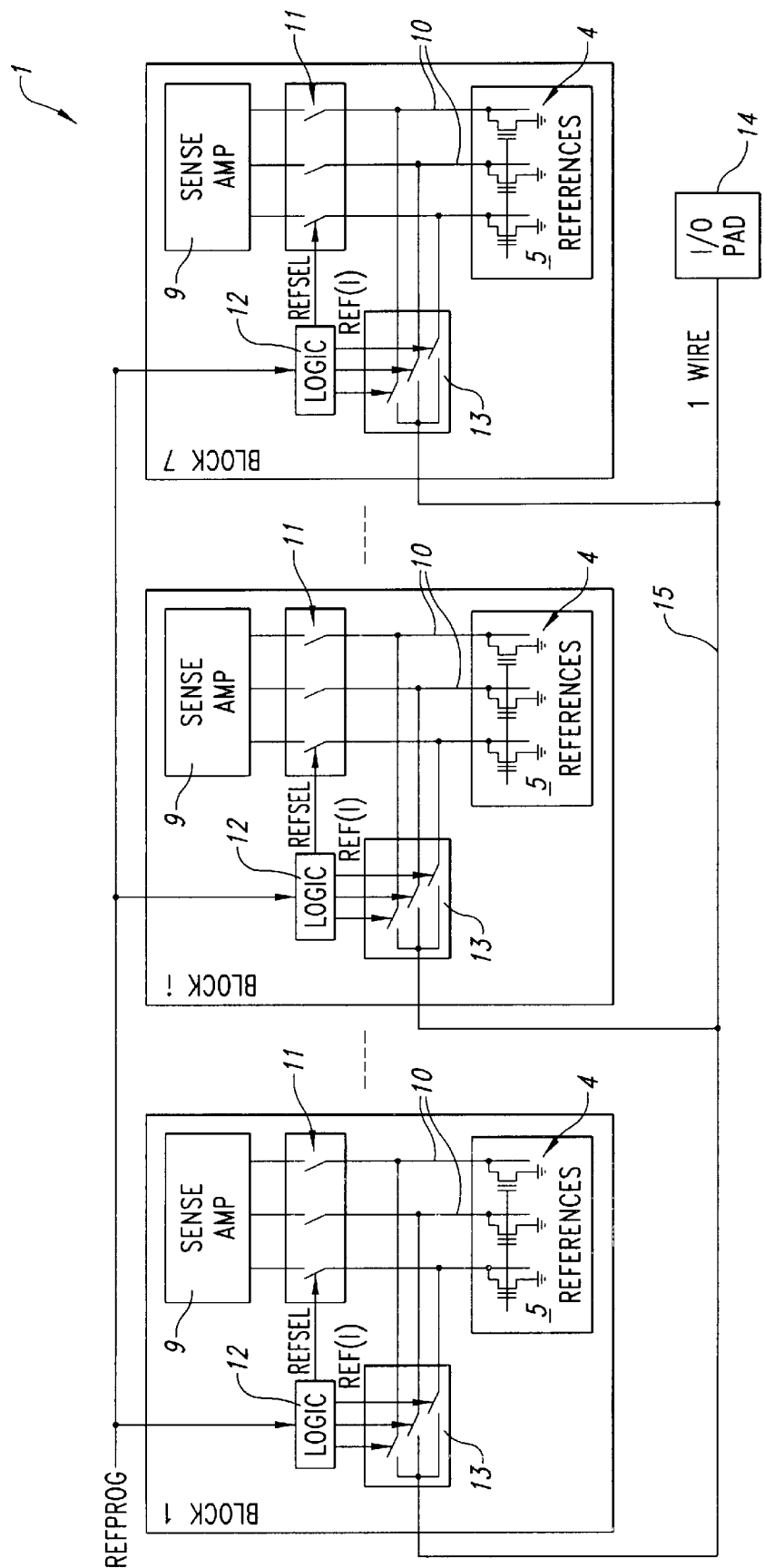
FIG. 3 schematically shows a circuit structure, formed according to the invention, for an electrically programmable/erasable non-volatile memory device incorporating a matrix of multi-level memory cells.

FIG. 3 schematically shows a plurality of sub-matrices 5 of reference cells 4 associated with the corresponding sense amplifiers 8 and corresponding matrix sectors (not shown).

Thus, the sub-matrix 5 of reference cells 4 is duplicated for each read sector BLOCK0, . . . , BLOCK7.

Each sector 6 can comprise two or more outputs, depending on the number of bits stored in the elementary memory cell. These outputs are obviously produced, by the read amplifying block or sense amplifier 9 associated with each sector 6 of the cell matrix.

Also shown are the conduction paths 10 linking the sub-matrix 5 of reference cells 4 to the sense amplifiers 9 which allow the memory cells to be read.

More particularly, the conduction paths 10 comprise bit lines of the sub-matrix 5 of reference cells 4 which extend towards the sense amplifiers 9 through a corresponding series of switches 11, the latter being parallel driven from the output of a logic circuit 12 by means of a signal REFSEL.

In addition, these bit lines branch off to a second series of normally open switches 13 which are individually selected and operated by respective control signals REF(i) emitted from the logic circuit 12.

The second series of switches 13 allows the bit lines 10 of the sub-matrix 5 of reference cells 4 to be connected to a single I/O terminal 14 through a single addressing line 15 over which an addressing signal is transmitted in the DMA mode, as explained hereinafter.

The logic circuit 12 is input a synchronization signal REFPROG acting on each read block and shared by each of the logic circuits 12 incorporated in each block BLOCKi.

Figure 4:
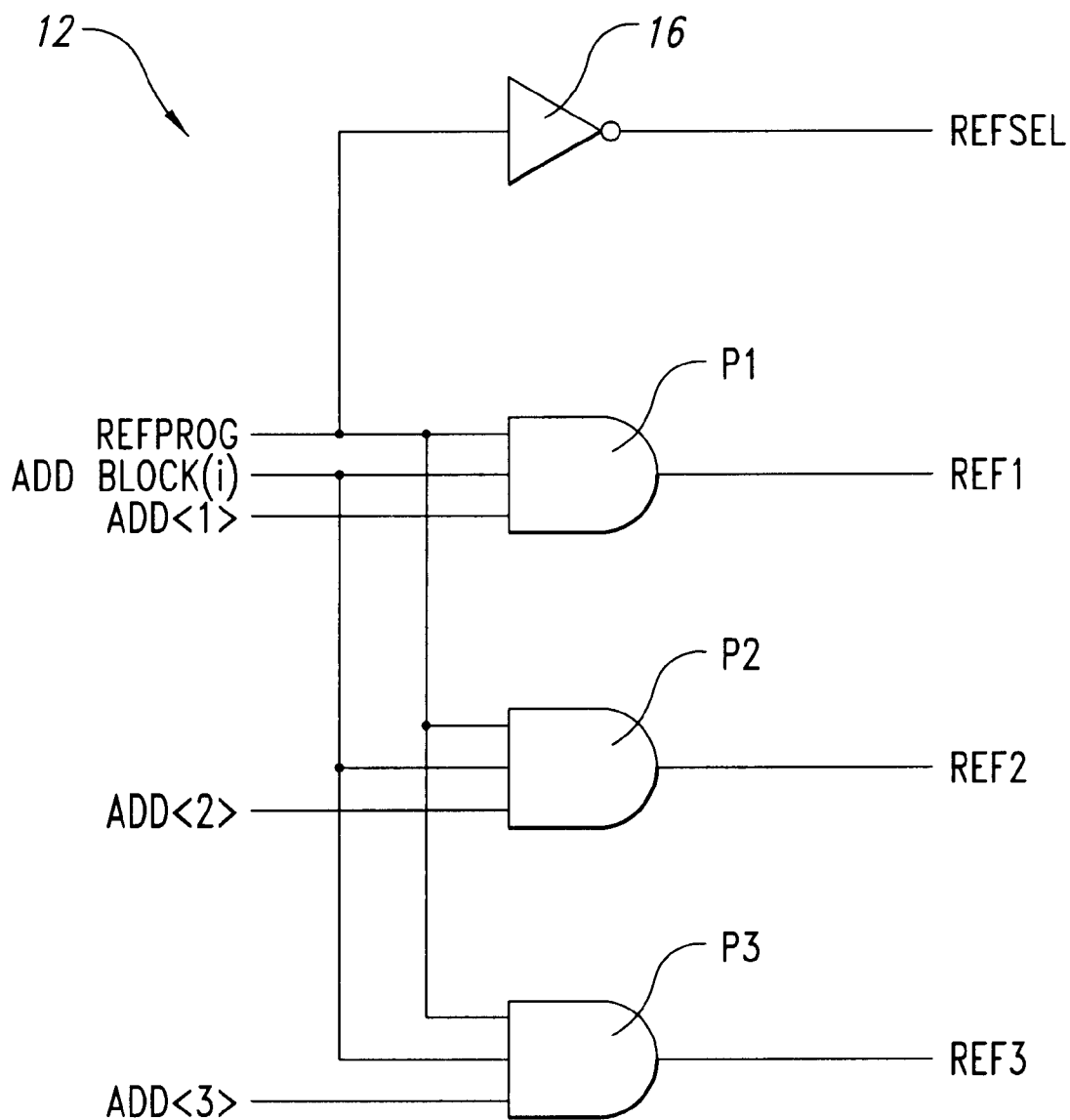
FIG. 4 shows a schematic view of a logic circuit of the circuit structure of FIG. 3.

Schematically shown in FIG. 4 is the internal construction of the logic circuit 12. In particular, the example of FIG. 4 relates to a multi-level memory having an elementary memory cell which is capable to store two informational bits. Thus, to address the three reference cells needed for discriminating the four levels of the memory cells, three identical addresses for all the read blocks BLOCK0, . . . , BLOCK7 (for the three corresponding reference cells), plus another address for selecting the individual block BLOCKi, are all the addresses required.

Likewise, with a memory device having sixteen outputs, two for each read block BLOCKi, eleven addresses would be required.

The REFSEL signal is basically derived from the logic reversal of the REFPROG signal, e.g., by using an inverter 16.

The logic circuit 12 further comprises a plurality of logic gates P1, P2, P3, . . . , Pn, with n being the number of bit lines of the reference cells to be addressed. For example, the logic gates may be of the AND type with three inputs. It should be understood that other types of logic gates or a different logic network could be used instead.

The REFPROG signal is applied to a first input of each of said logic gates P1, P2, P3, . . . , and an enable signal ADD BLOCK(i) is applied to a second input of each of said logic gates.

The third input of each logic gate P1,P2,P3 receives a respective addressing signal ADD<1>, ADD<2>, ADD<3> from an addressing pin, not shown because conventional.

The output of each logic gate represents a respective reference signal REF(i) issued from the logic circuit 12 to drive the second series of switches 13.

The method of operating the circuit structure will now be described with reference to a memory device which incorporates multi-level memory cells.

The reference cells 4 contained in the sub-matrix 5, external of the memory cell matrix, are directly accessible by the DMA (Direct Memory Address) technique. It should be noted that, contrary to standard two-level EPROMs, the reference cells 3 are not placed on reference bit lines similar to those of the memory matrix. This peculiarity is due to the DMA programming since, if all the cells connected to the reference bit lines were to be DMA programmed, program time would be inordinately long.

Furthermore, the presence of the only I/O terminal 14 is particularly advantageous to shorten the program time, since multiple I/O terminals would be hardly driven by testing equipment.

Accordingly, each read block BLOCKi is multiplexed outward, in this invention, through a single DMA mode addressing line.

The whole writing operation is controlled by the REF-PROG synchronization signal, which acts on each read block BLOCKi.

The path of the DMA addressing line 15, leading to each of the selected reference cells, is activated through the series of switches 13 as suitably driven from the logic circuit 12.

The path of the DMA addressing line 15, leading to each of the selected reference cells, is activated through the series of switches 13 as suitably driven from the logic circuit 12.

The reference cells are always read using the DMA technique, so that their values can be checked.

The DMA method has a major advantage in that the addressed reference cell can be programmed by a set of voltages suitably calibrated by the testing equipment. Also, the current being delivered therefrom can be measured by a further accurate check of its written state.

The circuit structure 1 does solve technical problems of the prior art and offers a lot of advantages, foremost among which is that it provides a simple and accurately controlled writing process of the reference cells of a multi-level memory. And this is obtained with minimized area occupation and circuit complexity.

Furthermore, the programming time of the reference cells is kept substantially the same for each matrix sector.

It should be understood that changes and modifications, within the scope of the following claims, may be made to the circuit structure of this invention by a skilled person in the art.

We claim:

1. A circuit structure for programming data in reference cells of an electrically programmable/erasable integrated non-volatile memory device, comprising:

a matrix of multi-level memory cells;

a reference cell sub-matrix of reference cells that is structurally independent of the memory cell matrix and includes a corresponding reference cell provided for comparison with a respective one of the memory cells during a read phase; and a DMA addressing line coupled to the reference cell sub-matrix for accessing the reference cells of the reference cell sub-matrix.

2. A circuit structure according to claim 1, further comprising:

a sense amplifier arranged for reading data from the cell matrix; and a conduction path established between the sub-matrix and the sense amplifier, said path including bit lines of the sub-matrix of reference cells, which are extended to said sense amplifier through a corresponding first series of switches driven in parallel by an output from a logic circuit.

3. A circuit structure according to claim 2, wherein said bit lines of the sub-matrix branch off to a second series of switches which are selected and individually operated by respective control signals issued from said logic circuit.

4. A circuit structure according to claim 3, wherein said second series of switches links the bit lines of the sub-matrix of reference cells to a single terminal through the DMA addressing line in a DMA access mode.

5. A circuit structure according to claim 2, wherein said logic circuit comprises a network of logic gates, all arranged to receive a synchronization signal applied to each read block of a plurality of read blocks of the memory matrix.

6. A circuit structure according to claim 5, wherein said synchronization signal is applied to a first input of each of said logic gates; an enable signal of the respective read block is applied to a second input of each of said logic gates; and a third input of each logic gate receives a respective addressing signal from an address pin.

7. A circuit structure according to claim 1, wherein the sub-matrix of reference cells is one of a plurality of sub-matrices of reference cells, the sub-matrices of reference cells corresponding respectively to a plurality of memory sectors of the memory cell matrix.

8. A circuit structure according to claim 7, wherein each memory sector is multiplexed outward through the DMA addressing line in a DMA mode.

9. A circuit structure according to claim 1, wherein said sub-matrix includes redundant word lines.

10. An electrically programmable/erasable integrated non-volatile memory device, comprising:
a memory cell matrix of memory cells;
a reference cell matrix of reference cells that includes a corresponding reference cell provided for comparison with a respective one of the memory cells during a read phase, the reference cell matrix including a plurality of bit lines coupled to a plurality of columns of reference cells, respectively;
a first plurality of switches coupled to the plurality of bit lines, respectively; and
a DMA addressing line coupled to each of the bit lines of the reference cell matrix by the first plurality of switches, for accessing the reference cells of the reference cell matrix.

11. The memory device of claim 10, further comprising:
a sense amplifier arranged for reading data from the memory cell matrix; and
a second plurality of switches respectively connecting the sense amplifier to the plurality of bit lines.

12. The memory device of claim 11, further comprising:
a logic circuit having a plurality of outputs connected respectively to the second plurality of switches, the logic circuit also having an additional output connected to the first plurality of switches.

13. The memory device of claim 12 wherein the logic circuit comprises a network of logic gates, all arranged to receive a synchronization signal applied to each read block of a plurality of read blocks of the memory matrix.

14. The memory device of claim 13, wherein the synchronization signal is applied to a first input of each of said logic gates; an enable signal of the respective read block is applied to a second input of each of said logic gates; and a third input of each logic gate receives a respective addressing signal from an address pin.

15. The memory device of claim 10 wherein the reference cell matrix includes a plurality of reference cell sub-matrices of reference cells and the memory cell matrix includes a plurality of memory sectors corresponding respectively to the reference cell sub-matrices, wherein each reference cell sub-matrix is coupled to the DMA addressing line.

16. An electrically programmable/erasable integrated non-volatile memory device, comprising:
a memory cell matrix of memory cells, the memory cell matrix including first and second memory sectors of memory cells;
a reference cell matrix of reference cells that includes first and second reference cell sub-matrices corresponding respectively to the first and second memory sectors, each of the first and second reference cell sub-matrices including a plurality of groups of reference cells;
a first plurality of switches coupled respectively to the groups of reference cells of the first reference cell sub-matrix;
a second plurality of switches coupled respectively to the groups of reference cells of the second reference cell sub-matrix; and
a DMA addressing line coupled to the reference cell sub-matrices by the first and second pluralities of switches, respectively.

17. The memory device of claim 16, further comprising:
first and second sense amplifier arranged for reading data from the first and second reference cell sub-matrices, respectively;
a third plurality of switches respectively connecting the first sense amplifier to the groups of reference cells of the first reference cell sub-matrix; and
a fourth plurality of switches respectively connecting the second sense amplifier to the groups of reference cells of the second reference cell sub-matrix.

18. The memory device of claim 16, further comprising:
a first logic circuit having a plurality of outputs connected respectively to the first plurality of switches, the first logic circuit also having an additional output connected to the third plurality of switches; and
a second logic circuit having a plurality of outputs connected respectively to the second plurality of switches, the second logic circuit also having an additional output connected to the fourth plurality of switches.

19. The memory device of claim 18 wherein the logic circuits each comprise a network of logic gates, all arranged to receive a same synchronization signal.

20. The memory device of claim 16 wherein the groups of reference cells of the first reference cell sub-matrix are columns of reference cells, the references cells of each column being coupled to each other by a respective bit line of a first plurality of bit lines that are respectively connected to the DMA addressing line by the switches of the first plurality of switches.

* * * * *